(12) United States Patent
Sill et al.

(10) Patent No.: US 6,214,720 B1
(45) Date of Patent: Apr. 10, 2001

(54) PLASMA PROCESS ENHANCEMENT THROUGH REDUCTION OF GASEOUS CONTAMINANTS

(75) Inventors: Edward L. Sill, Phoenix; Thomas Licata, Mesa, both of AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/294,419

(22) Filed: Apr. 19, 1999

(51) Int. Cl.[7] .......................... H01L 21/306; H01L 21/00; C23F 1/12
(52) U.S. Cl. .......................... 438/622; 438/734; 438/710; 438/694; 134/1; 134/2
(58) Field of Search .................. 438/618, 622, 438/692, 694, 723, 724, 712, 710, 905, 909

(56) References Cited

U.S. PATENT DOCUMENTS

| | | | | |
|---|---|---|---|---|
| 4,704,301 | * | 11/1987 | Bauer et al. .......................... | 438/618 |
| 5,824,375 | * | 10/1998 | Gupta .................................... | 427/569 |
| 5,972,790 | | 10/1999 | Arena et al. .......................... | 438/649 |
| 6,003,526 | * | 12/1999 | Lo et al. ............................... | 216/58 |

* cited by examiner

Primary Examiner—Matthew Smith
Assistant Examiner—Igwe U. Anya
(74) Attorney, Agent, or Firm—Wood, Herron & Evans, LLP

(57) ABSTRACT

A method for improving the efficiency of a plasma process such as a sputter process. A low partial pressure of a gas such as oxygen liberated from a substrate in a reaction chamber is maintained. The low partial pressure may be maintained by providing a plasma gas having a mass that is about equal to or greater than the liberated gas to the reaction chamber at a rate so that the steady state ratio of the plasma gas to the liberated gas is at least 1. The plasma gas is preferably argon. Alternatively a low partial pressure may be maintained by providing an in situ getter or a reactive, condensation or selective pump in the chamber. The method is applicable to a sputter etch or a sputter deposition process.

27 Claims, 4 Drawing Sheets

PLASMA PROCESS ENHANCEMENT THROUGH REDUCTION OF GASEOUS CONTAMINANTS

FIELD OF THE INVENTION

The invention is directed generally to the formation of integrated circuits, and more specifically to a method of improving the rate of a plasma process.

BACKGROUND OF THE INVENTION

In the formation of integrated circuits (IC), thin films containing metal and metalloid elements are often deposited upon the surface of a semiconductor substrate or wafer. These thin films provide conductive and ohmic contacts in the circuits and between the various devices of an IC. For example, a thin film of a desired metal might be applied to the exposed surface of a contact or via hole on a semiconductor substrate, with the film passing through the insulating layers on the substrate to provide plugs of conductive material for the purpose of making interconnections across the insulating layers.

In processing semiconductor substrates or wafers to form an IC, sputter etching is a technique that is often used to remove a layer of unwanted material or an excess quantity of a material from the wafer surface. The process of sputter etching is generally known and takes advantage of the momentum of gas ions accelerated in an electric field. During sputtering, a gas is ionized and the gas ions are accelerated and collide with the surface of the material to be sputtered. During the collision, part of an ion's momentum is transferred to the surface of the material. The ionized particles of the charged gas plasma bombard the surface of the wafer and, if sufficient momentum is transferred, atoms and/or molecules are removed or etched from the surface.

In sputter etching, a gas is introduced into a processing chamber. The processing chamber may be metal, quartz or a dielectric other than quartz, and preferably is vacuum sealed. The wafer to be etched is supported on an electrical base or electrode within the reaction chamber so that the wafer develops an electrical potential or bias. A working gas is introduced into the vacuum chamber opposite the surface of the biased wafer, and energy is capacitively or inductively coupled to the gas through the processing chamber wall, such as by using an induction coil which surrounds the processing chamber. The energy from the induced field ionizes the gas particles so that they acquire a net charge that is of the opposite polarity to the potential of the wafer support and the wafer. The ionized particles of the gas collectively form what is referred to as a gas plasma or plasma cloud. Since the ionized particles of the plasma and the wafer are of opposite polarities, the ionized particles in the plasma are attracted to the wafer's surface, bombarding the surface of the wafer and dislodging material particles from the wafer to consequently etch the wafer surface.

For deposition processes, the sputter etching commonly occurs at wafer voltages of about 1000 volts (1 kilovolt). However, this relatively high voltage is inappropriate for microelectronic devices which are more susceptible to surface damage at these wafer charging voltages. As a result, lower wafer voltages, below 500 volts, are more desirable. Plasma etching that is accomplished using these lower wafer voltages and with a plasma generated independent from the bias on the wafer is referred to as a soft plasma etch.

The etch process occurs in a reaction chamber within which a low gas pressure is maintained. The gas, usually argon, is introduced and ionized via electron collision in an oscillating electromagnetic field (EMF). The accelerating voltage is supplied either by a separate radio frequency (RF) power supply, or in many cases may be the same power supply that provides for the ionization. Constant pressure is maintained by controlling the rates at which the sputtering gas is introduced into and is removed from the chamber.

The etch process is a first step in a variety of process sequences. One example is the fabrication of suicides where a contact surface is cleaned using sputter etch and a metal such as titanium (Ti) may be deposited over a metal oxide semiconductor structure to react with exposed silicon (Si), such as source and drain regions, to form metal silicides. Following the formation of the silicide regions, a selective acid etch has been used to remove unreacted metals without attacking the silicide. This removal is accomplished by completing the process to deposit the metal in the substrate, removing the substrate from the reactor, allowing the substrate to cool to room temperature and then etching the substrate with hydrogen peroxide, hydrogen peroxide containing a very small amount of ammonium hydroxide, or a mixture of hydrogen peroxide and sulfuric acid. This etch process removes any excess metallic Ti on the substrate as well as any substoichiometric titanium silicide ($TiSi_x$) formed on the silicon dioxide. This method of forming silicides is disclosed in U.S. patent application Ser. No. 08/489,040 entitled METHOD FOR FORMING SILICIDES, filed Jun. 9, 1995 (inventor Arena) and assigned to Tokyo Electron Limited which is herein incorporated by reference in its entirety.

During the plasma etch process, $SiO_2$ is removed or etched from the surface of the material. The plasma further dissociates this $SiO_2$. The by-products of the $SiO_2$, which include silicon monoxide (SiO) and atomic oxygen (O), are liberated and released into the plasma. The effect of the increased concentration of oxygen in the plasma, however, is a reduction in the rate of a $SiO_2$ sputter process, such as a reduction in the sputter etch rate. A reduced sputter etch rate decreases the time efficiency, decreases wafer throughput and hence increases the cost of the entire process. Thus, a method is needed whereby sputter etch of $SiO_2$ and other dielectric materials may be accomplished without the undesirable concomitant decrease in the sputter rate or having to resort to an increase in the ion energy.

SUMMARY OF THE INVENTION

The invention is directed to a method of increasing the efficiency of a plasma process by reducing gaseous contaminants. The plasma process may include sputter etching, reactive ion etching, plasma chemical vapor deposition (CVD), ion milling, and reactive ion milling. In sputter etching of a substrate that liberates oxygen, nitrogen or other species of rate inhibiting by-product contaminants, the method maintains a low partial pressure of the gas in the reaction chamber. The low partial pressure may be maintained by a number of processes. One preferred process is by providing a plasma gas to the reaction chamber containing the substrate at a rate such that the steady state ratio of plasma gas to liberated oxygen, nitrogen or other contaminant gas species is at least 1. In a particularly preferred embodiment, the plasma gas has a mass greater than the oxygen, nitrogen or other gas species. Other methods of reducing contaminant gas partial pressure are by providing an in situ getter or by providing a reactive pump.

The invention is also directed to a process to sputter etch a substrate having a $SiO_2$ layer in a reaction chamber in which oxygen is produced during the etch process by providing argon to the substrate in the chamber at a rate so that the steady state ratio of argon to oxygen is at least 1.

The invention is additionally directed to a high throughput rate process for the formation of suicides and multilevel interconnect component layers of a substrate. One preferred process is by providing a plasma gas to the reaction chamber containing the substrate at a rate such that the steady state ratio of plasma gas to liberated oxygen, nitrogen or other contaminant gas species is at least 1. In a particularly preferred embodiment, the plasma gas has a mass greater than the oxygen, nitrogen or other gas species. Other methods of reducing contaminant gas partial pressure are by providing an in situ getter or by providing a reactive pump.

The above and other objects and advantages of the present invention shall be made apparent from the accompanying drawings and the description thereof. The accompanying drawings, which are incorporated in and constitute a part of this specification, illustrate embodiments of the invention and, together with a general description of the intention given above, and the detailed description of the embodiments given below, serve to explain the principles of the invention.

DETAILED DESCRIPTION

Figure 1:
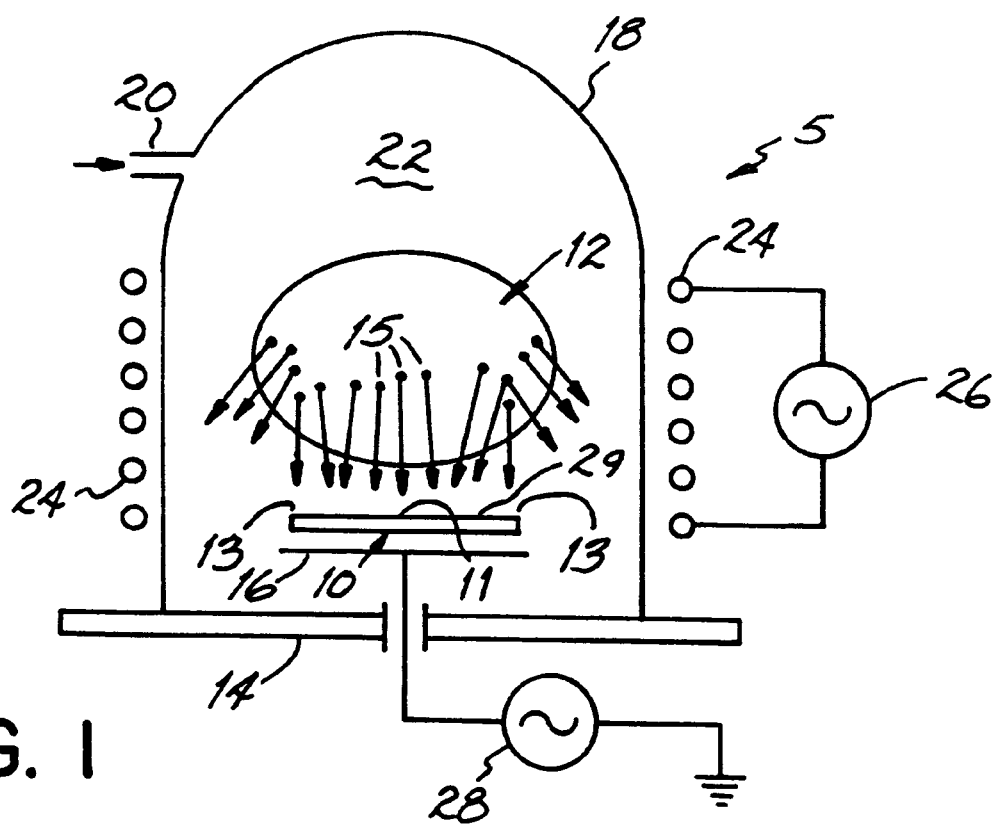
FIG. 1 is a side view, partially in cross-section, of a deposition chamber used to practice the method of the present invention.

With reference to FIG. 1, a plasma sputter etch chamber 5 is shown for sputter etching a substrate or semiconductor wafer 10 using an ionized gas plasma cloud 12. The chamber is, disclosed in U.S. Pat. No. 5,391,281 filed Apr. 9, 1993 and assigned to Tokyo Electron Limited, and is expressly incorporated by reference herein in its entirety. The processing chamber 5 has a base 14 which includes a wafer support 16 to hold wafer 10 inside the chamber 5 while it is being etched. Wafer 10 sits upon support 16 and is enclosed within chamber 5 by a dielectric cover 18 which is vacuum sealed to the base 14 to create a processing space 22 within processing chamber 5 which is suitable for plasma etching of wafer 10.

An etching gas such as argon is introduced into chamber 5 through gas inlet 20 and the wafer 10 is positioned on support 16 within chamber 5 such that the etching gas introduced into the processing space 22 via gas inlet 20 is substantially above the top surface 29 of wafer 10. The dielectric chamber cover 18 is typically made of quartz and electrical energy is inductively coupled to the gas contained within processing space 22 through an induction coil 24 which surrounds cover 18 of the process chamber 5. The coil 24 is supplied by an intermediate frequency power source 26 which may operate at a frequency of around 450 KHz. Electrical energy from coil 24 is inductively coupled to the etching gas so as to ionize the gas and create an ionized gas plasma cloud 12 which is made up of ionized particles 15 and free electrons 15. The plasma cloud 12 is confined substantially above the wafer support 16 and wafer 10.

To perform the etching process on wafer 10, the wafer 10 is electrically charged or biased through its contact with wafer support 16. The wafer support 16 may be electrically coupled to a high frequency electrical energy source 28 operating typically at a frequency around 13.5 MHz with the coil 24 supplied by a low frequency energy source. Alternatively, the wafer support 16 may be coupled to a low frequency energy source and the coil 24 may be coupled to a high frequency energy source, or both sources may operate at the same frequency. The wafer 10 is charged by source 28 and support 16 to have an electrical charge that is of an opposite polarity to the ionized particles 15 in the plasma cloud 12. Normally, the ionized plasma includes positively charged particles and free electrons. Therefore, a negative bias is applied to the wafer 10 and an electrical field is established between the plasma 12 and the wafer 10. The positively ionized particles 15 from cloud 12 are attracted downwardly to the upper surface 29 of wafer 10 under the influence of the electric field, where they bombard the top surface 29 of the wafer 10 with sufficient energy to remove or sputter away a layer of the upper wafer surface 29. In a sputter etch of $SiO_2$, argon is the preferred gas to form a plasma. Other gases such as krypton, neon and xenon may be used, but these are less preferred because of their cost. When argon is used in the described hardware configuration, the argon flow is introduced into the chamber at a rate of at least 2 sccm for a 35 liter vessel with a 400 liter/sec pump throttled to achieve a process pressure of from 1–20 milli-Torr (mT).

A gas that is generated during the plasma process, such as an etch process, a deposition process, or a combination of an etch and a deposition process, reduces the efficiency of the coincident process by forming rate limiting by-products. Thus a reduction in these gaseous contaminants will increase the efficiency of the coincident process. When the argon or other gas is used to generate the plasma 12 in sputtering $SiO_2$, $SiO_2$ is removed from the substrate surface 29 and contributes oxygen to the plasma 12. This altered plasma further dissociates $SiO_2$ that has already been removed from the surface of the substrate 29, yielding a plasma with a high oxygen concentration. A high oxygen concentration is undesirable since oxygen, having a lower mass than argon, krypton, neon or xenon, becomes less efficient at sputtering $SiO_2$ and therefore reduces the coincident sputter etch rate of $SiO_2$. Oxygen also lowers the electron temperature of the plasma 12, leading to a further reduction in the sputter rate. Plasma temperature is generally taken to be the average electron temperature or kinetic energy. $SiO_2$, with molecular bonds typically weaker than the energy required to ionize argon, cools off the plasma. This is because dissociation of the $SiO_2$ molecule removes electrons before they have gained enough energy to ionize argon (energy required to break an oxygen-silicon bond is 8.16 V; energy required to break an oxygen-oxygen bond is 5.16 V; energy required to ionize argon is 15.68 V), thus reducing the plasma temperature.

It will be appreciated, however, that the method of the invention is not limited to having oxygen as the contaminant gas. Other contaminants may include elements such as nitrogen, hydrogen, carbon, and the halogens fluorine, chlorine, bromine, and iodine, any of which may be present alone or in combination. For example, materials with a low dielectric constant (low k) may liberate solvent or other molecules of oxygen, hydrogen or carbon. These molecules may be liberated into the plasma and may decrease the etch efficiency as previously described. Alternatively, in plasma enhanced chemical vapor deposition (PECVD), nitrogen, hydrogen, oxygen or combinations of these gases or other reaction limiting by-products can be liberated as a result of chemical reactions on the surface.

By increasing the rate at which the plasma gas is introduced into and removed from the processing space 22, while maintaining the pressure in the reaction chamber 5, a high steady-state ratio of plasma gas to oxygen or other liberated gas is obtained. The high flow of plasma gas in effect sweeps oxygen and/or other liberated gas out of the chamber 5 and maintains their low steady state concentration. This increased sputter rate is desirable for increasing wafer throughput. The higher concentration of plasma gas reduces the effect of oxygen or other liberated gas, with the result that the etch rate, such as $SiO_2$ etch rate, is less affected and thus an efficient sputtering rate results.

Contaminant gases may also be reduced in the chamber by other methods. Examples of such methods are by providing an in situ getter in the chamber or by providing a pump in the chamber. Examples of such pumps could be a reactive pump, a condensation pump or a selective pump such as a titanium sublimation pump and a cold trap to scavenge water.

The process of the invention may be used with any type of plasma sputter etch apparatus. Advantageously, the process of the invention would be used concomitantly with a physical apparatus to limit the amount of oxygen in the chamber. Such an apparatus is disclosed in a co-pending application entitled APPARATUS AND METHOD FOR ELECTROSTATICALLY SHIELDING AN INDUCTIVELY COUPLED RF PLASMA SOURCE AND FACILITATING IGNITION OF A PLASMA by Edward L. Sill, inventor, U.S. patent application Ser. No. 09/255,613, filed on Feb. 19, 1999, and assigned to Tokyo Electron Limited and incorporated by reference herein in its entirety. However, when conditions are altered, such as changing the physical dimensions of the chamber 5 or changing the pumping speed, capacity or pressure, the flow rates of the gas will correspondingly have to be altered to achieve the same results.

EXAMPLE 1

The effect of free $O_2$ in the plasma on the sputtering rate was demonstrated. An etch of $SiO_2$ was performed in the same chamber prior to an etch of polycrystalline silicon (poly-Si). The poly-Si, being released from the wafer, will getter any free oxygen adhering to the walls of the chamber and hence remove the oxygen. The chamber pressure was 10 mT, and the chamber was equipped with a Faraday Shield as disclosed in the aforementioned co-pending application. The inductively coupled plasma (ICP) power was 1000 watts (W) and the DC bias was –100 volts (V).

At the outset of the $SiO_2$ sputter etch process and with a flow of 2 sccm argon, the sputter etch rate was less than 400 Å/min. After processing ten poly-Si wafers, the sputter etch rate had increased to about 575 Å/min. To illustrate that the sputter rate decreased with an increased number of $SiO_2$ wafers processed, a similar experiment was performed using the same 2 sccm argon flow rate. An etch of poly-Si was performed in the same chamber prior to an etch of $SiO_2$ wafers. As expected, the sputter etch rate decreased from 80 Å/min to 45 Å/min after processing nine $SiO_2$ wafers.

EXAMPLE 2

By increasing the argon flow from 2 sccm to 95 sccm, there was an 85% increase in the etch rate of $SiO_2$.

EXAMPLE 3

Figure 2:
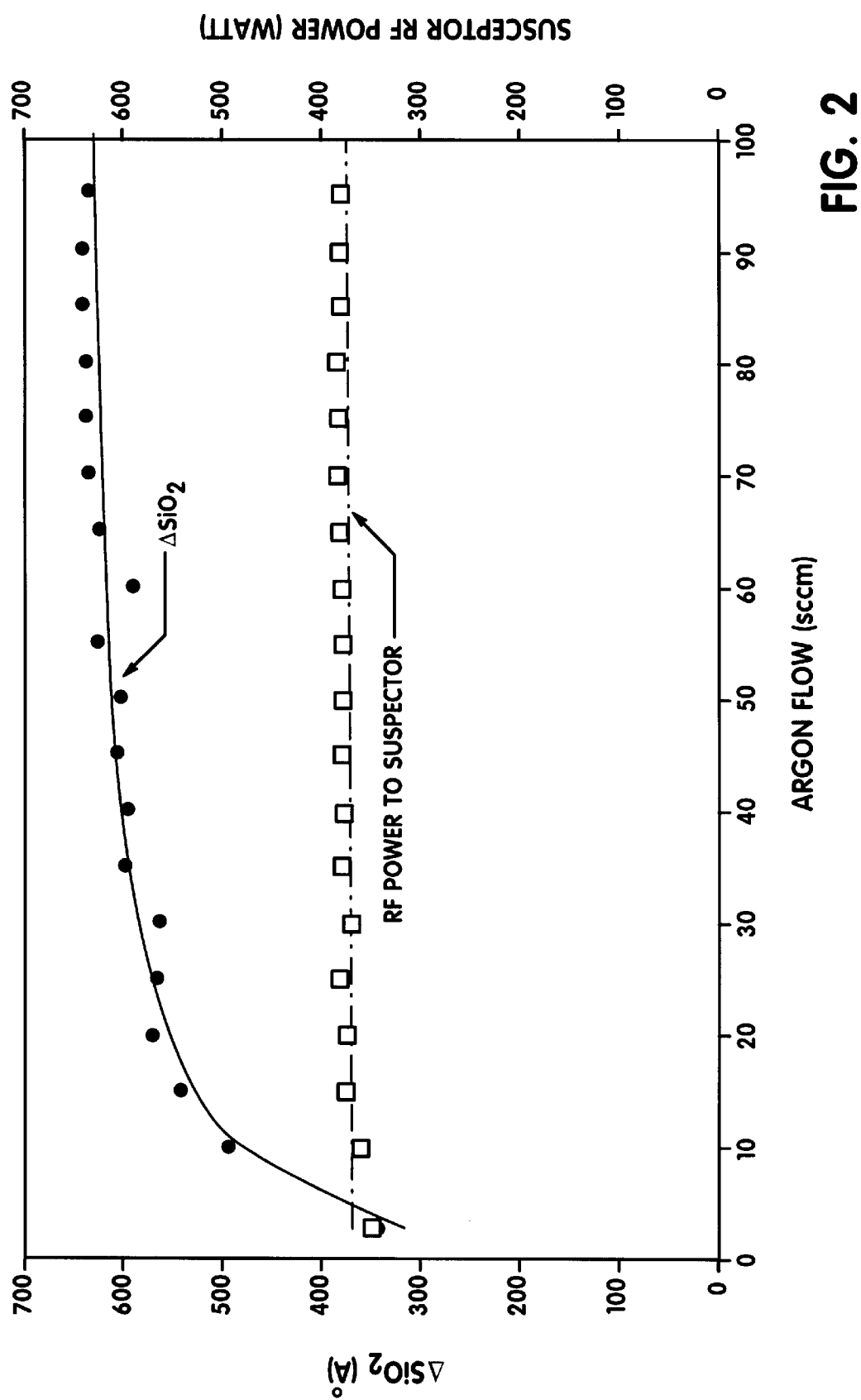
FIG. 2 is a graph of the change in $SiO_2$ versus argon flow rate.

FIG. 2 is a graph of the change in $SiO_2$ etch rates at various argon flow rates (closed circles). The chamber pressure was 10 mT and the chamber was equipped with a Faraday Shield. The ICP power was 1000 W and the DC bias in the chamber was –100 V. The RF power to the susceptor remained constant throughout at about 375 W, as shown by the open squares. This, in addition to the constant –100 V bias indicated a constant current, i.e., a constant number of ions striking the wafer surface.

At an argon flow of about 3 sccm the etch rate, as indicated on the change in $SiO_2$ ordinate on the left side of the graph, was less than about 345 Å/min. As the argon flow increased, the etch rate increased until, at an argon flow of about 95 sccm, the etch rate was greater than 640 Å/min.

EXAMPLE 4

Figure 3:
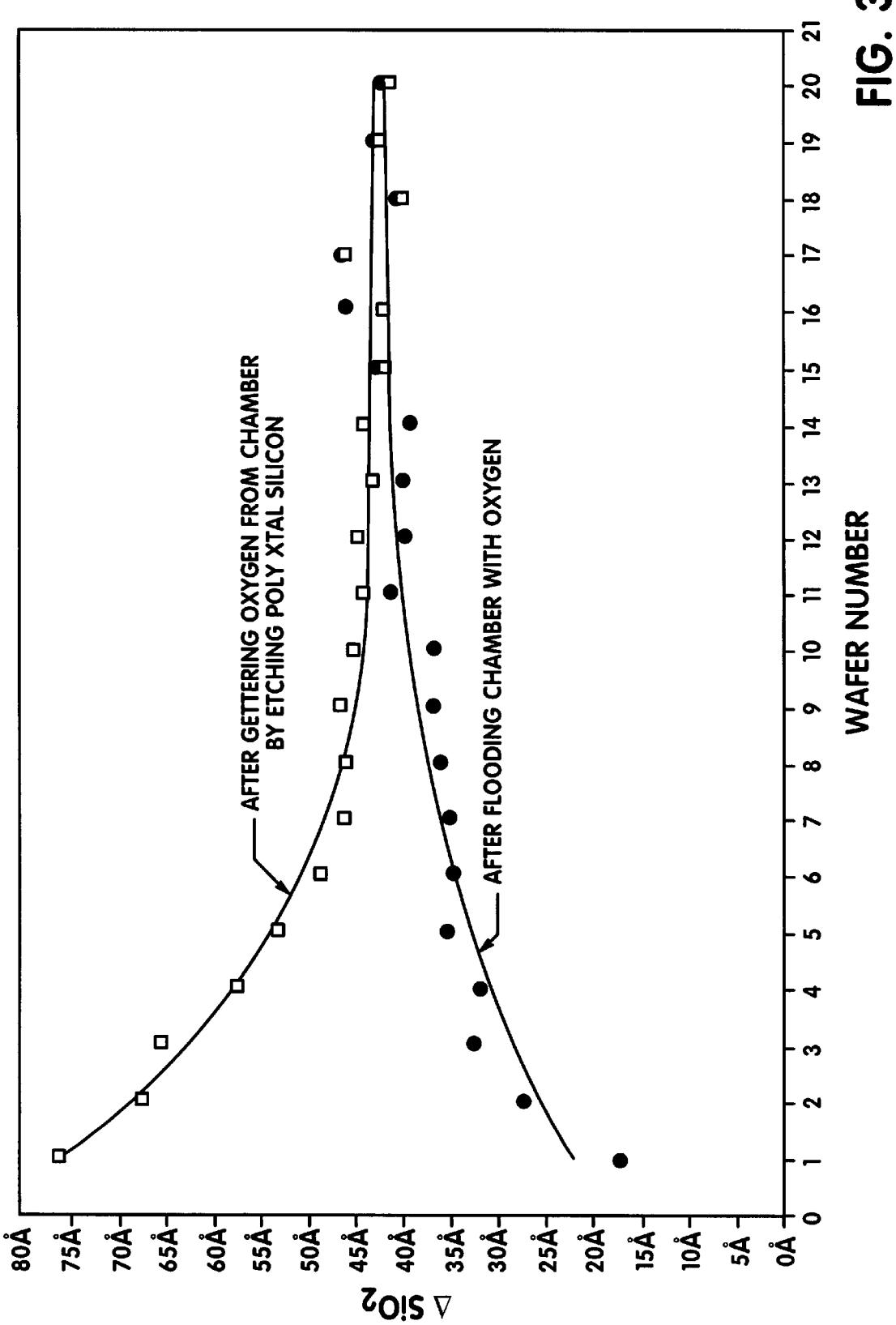
FIG. 3 is a graph of the change in $SiO_2$ versus wafer number processed.

With reference to FIG. 3, the effect of oxygen in the chamber upon the sputtering rate of subsequently processed wafers is shown. Each point was obtained from the average of three wafers. The chamber pressure was 8.0 mT, the ICP power was 1000 W and the DC bias was –100 V.

The chamber was flooded with oxygen and 20 consecutive wafers (closed circles) were etched for one minute each. At the outset after the initial flooding of the chamber with oxygen, the etch rate of the first wafer processed was about 17 Å. The etch rate of wafer 2 was about 27 Å, wafer 3 was about 33 Å, wafer 4 was about 33 Å, wafers 5–7 were about 35 Å, wafer 8 was about 36 Å, wafers 9 and 10 were about 37 Å, and wafers 11–20 were about 41 Å. Thus, as oxygen was depleted from the chamber with each subsequent wafer etch, the sputtering rate reached a maximum of about 41 Å after the tenth wafer was processed.

A similar experiment was performed to demonstrate the effect of oxygen in the chamber when oxygen had been removed from the chamber by etching poly-Si wafers only. This is shown by the open squares in FIG. 3. At the outset, the sputter etch rate of wafer 1 was about 76 Å. The sputter etch rate of subsequently processed wafers was about 67 Å for wafer 2, about 64 Å for wafer 3, about 58 Å for wafer 4, about 54 Å for wafer 5, about 50 Å for wafer 6, about 46 Å for wafers 7–10, and about 43 Å for wafers 11–20. Thus, the sputtering rate decreased when a chamber in which oxygen had been removed became oxygen rich as oxygen was liberated from sputtered $SiO_2$ during processing.

EXAMPLE 5

Figure 4:
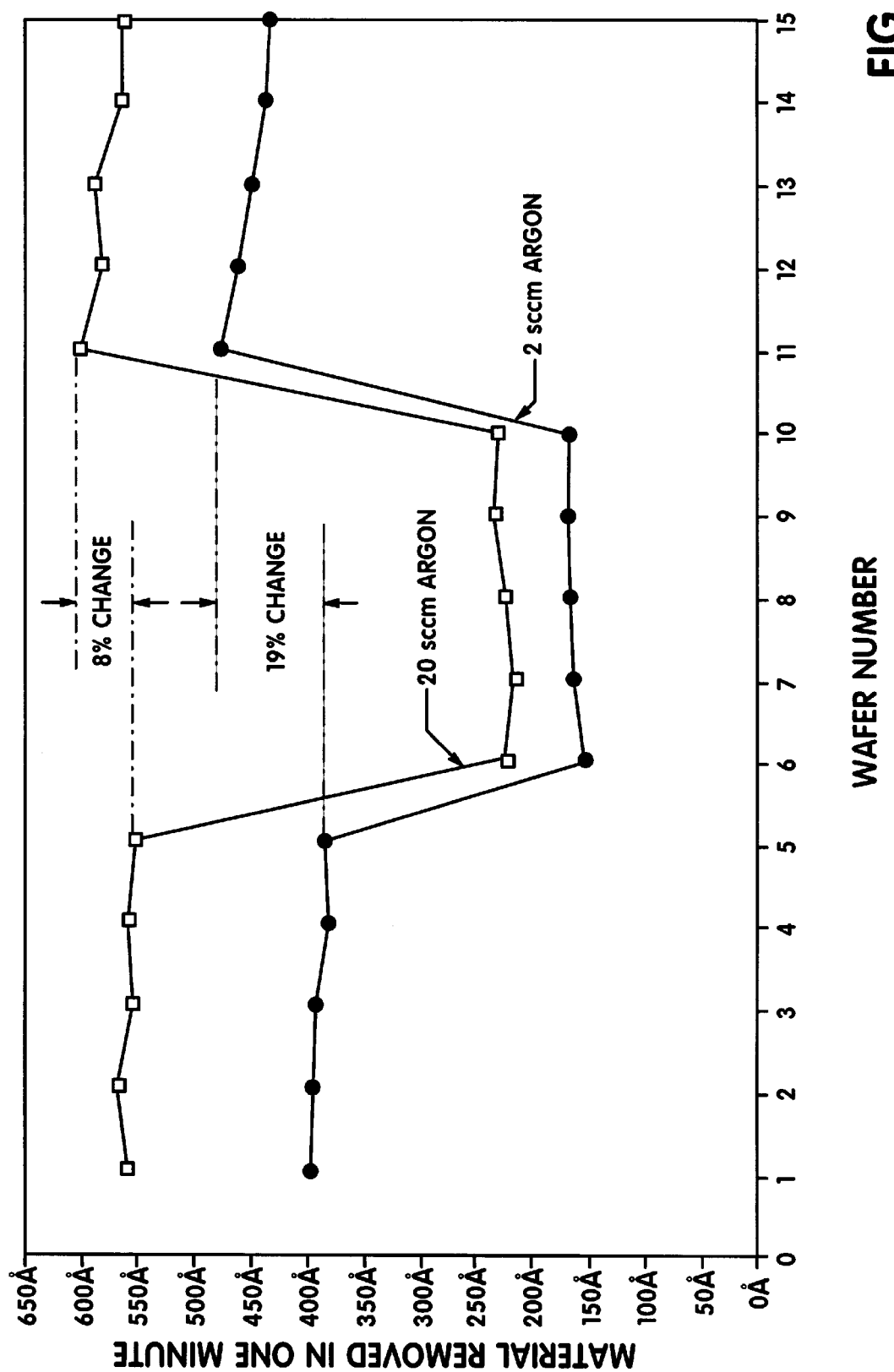
FIG. 4 is a graph showing the chamber memory effect of oxygen versus argon flow.

With reference to FIG. 4 the chamber "memory effect"versus the argon flow rate was demonstrated. The closed circles indicate sputter etch using a flow of 2 sccm argon. The open squares indicate sputter etch using a flow of 20 sccm argon.

With reference to the 2 sccm argon flow (closed circles) $SiO_2$ wafers 1–5 were etched in a steady state condition with about 400 Å material removed in one minute for wafer 1, 395 Å for wafer 2, 390 Å for wafer 3, 380 Å for wafer 4, and 385 Å for wafer 5. At wafer 6 the wafers were switched to poly-Si wafers to remove or getter oxygen from the chamber. The etch rate of wafer 6 decreased to about 155 Å material removed in one minute, and remained at about 165 Å material removed in one minute throughout processing of subsequent wafers 7–10. At wafer 11, the wafers were replaced with $SiO_2$ wafers. The etch rate of wafer 11 increased to about 480 Å and then fell slightly during processing of wafers 12–15 in a linear fashion until a rate of about 440 Å was achieved at wafer 15. Wafer 11, processed immediately after the last polycrystalline and silicon wafer was processed, had the highest etch rate of about 480 Å. As the oxygen content increased upon processing wafers 11–15, the $SiO_2$ etch rate decreased.

With a flow of 20 sccm argon (open squares) the same pattern was observed but at higher overall etch rates. The etch rate of wafer 1 was about 560 Å and remained at that rate throughout processing of wafers 2–5. At wafer 6, poly(Si) wafers were etched to getter oxygen from the chamber. At wafer 6, the etch rate decreased to about 230 Å and remained roughly at about 230–240 Å throughout processing of wafers 7–10. Upon resuming sputter etch of $SiO_2$ wafers, the etch rate increased. The etch rate of wafer 11 increased to about 600 Å and then slowly and linearly decreased to about 580 Å in wafers 12–13 and 565 Å in wafers 14–15.

At a flow rate of 20 sccm argon, there was about an 8% increase in etch rate after poly-Si wafers (wafers 11–15) were etched versus the etch rate before (wafers 1–5) they were etched. At a flow rate of 2 sccm argon, there was about a 19% increase in etch rate after poly-Si wafers (wafers 11–15) were etched versus before (wafers 1–5) they were etched. At the 20 sccm argon flow, the 8% change versus the 19% change at the 2 sccm argon flow was less, due to the higher removal rate of the oxygen released from the oxide.

It should be understood that the embodiments of the present invention shown and described in the specification are only preferred embodiments of the inventor who is skilled in the art and are not limiting in any way. As one example, it has been determined that a plasma gas flow beyond 100 sccm argon is of no additional use in increasing the sputter rate for the described hardware configuration. As another example, the method may also improve the efficiency of a sputter deposition or reactive etching process. Alternatively, the invention could improve plasma CVD processes where rate limiting by-products are generated. Still further, the level of contaminant rate-limiting by-products may be reduced by pulsing the process, either a deposition or an etch process. In a pulsed process, the contaminants would not reach as high a level as in a non-pulsed process. Therefore, various changes, modifications or alterations to these embodiments may be made or resorted to without departing from the spirit of the invention and the scope of the following claims.

What is claimed is:

1. A method of enhancing the efficiency of a plasma process selected from the group of an etching process, a milling process, a deposition process and combinations thereof in a chamber comprising reducing in said chamber during said process a contaminant that is a rate limiting by-product of said process.

2. The method of claim 1 wherein said contaminant comprises an element selected from the group consisting of oxygen, nitrogen, hydrogen, carbon, fluorine, chlorine, bromine, iodine and combinations thereof.

3. The method of claim 1 wherein said contaminant is oxygen.

4. The method of claim 1 wherein said contaminant is reduced by a method selected from the group consisting of providing a plasma gas to said chamber at a rate wherein a steady state ratio of said plasma gas to said contaminant is at least 1, providing an in situ getter in said chamber, providing a reactive pump in said chamber and combinations thereof.

5. The method of claim 4 wherein said ratio of plasma gas to contaminant is in the range of about 3 to 67.

6. The method of claim 4 wherein said plasma gas has a mass greater than said contaminant.

7. The method of claim 6 wherein said plasma gas is selected from the group consisting of argon, neon, xenon, krypton and combinations thereof.

8. The method of claim 6 wherein said plasma gas is argon.

9. The method of claim 1 wherein said process comprises sputtering by a method selected from the group consisting of an etch process, a deposition process and combinations thereof.

10. A method of sputtering a substrate in a reaction chamber comprising maintaining in said reaction chamber during said sputtering a low partial pressure of a gas liberated from said substrate by said sputtering.

11. The method of claim 10 wherein said gas is selected from the group consisting of oxygen, nitrogen, hydrogen, carbon, fluorine, chlorine, bromine, iodine and combinations thereof.

12. The method of claim 10 wherein said gas is oxygen.

13. The method of claim 10 wherein said low partial pressure is maintained by a method selected from the group consisting of providing a plasma gas to said chamber at a rate wherein a steady state ratio of said plasma gas to said liberated gas is at least 1, providing an in situ getter in said chamber, providing a reactive pump in said chamber and combinations thereof.

14. The method of claim 13 wherein said ratio of plasma gas to liberated gas is in the range of about 3 to 67.

15. The method of claim 13 wherein said plasma gas has a mass greater than said liberated gas.

16. The method of claim 15 wherein said plasma gas is selected from the group consisting of argon, neon, xenon, krypton and combinations thereof.

17. The method of claim 15 wherein said plasma gas is argon.

18. The method of claim 10 wherein said sputtering is by a process selected from the group consisting of an etch process, a deposition process and combinations thereof.

19. A high throughput rate process for the formation of silicides and multilevel interconnect component layers of a substrate in a chamber comprising reducing in said chamber a contaminant that is a rate limiting by-product of said process.

20. The process of claim 19 wherein said contaminant is selected from the group consisting of oxygen, nitrogen, hydrogen, carbon, fluorine, chlorine, bromine, iodine and combinations thereof.

21. The process of claim 19 wherein said contaminant is oxygen.

22. The process of claim 19 wherein said contaminant is reduced by a method selected from the group consisting of providing a plasma gas to said chamber at a rate wherein a steady state ratio of said plasma gas to said contaminant is at least 1, providing an in situ getter in said chamber, providing a reactive pump in said chamber and combinations thereof.

23. The process of claim 22 wherein said ratio of plasma gas to contaminant is in the range of about 3 to 67.

24. The process of claim 22 wherein said plasma gas has a mass greater than said contaminant.

25. The process of claim 22 wherein said plasma gas is selected from the group consisting of argon, neon, xenon, krypton and combinations thereof.

26. The process of claim 22 wherein said plasma gas is argon.

27. The process of claim 19 comprising sputtering by a method selected from the group consisting of an etch process, a deposition process and combinations thereof.

* * * * *

UNITED STATES PATENT AND TRADEMARK OFFICE
CERTIFICATE OF CORRECTION

PATENT NO.    : 6,214,720 B1
DATED         : April 10, 2001
INVENTOR(S)   : Sill and Licata It is certified that error appears in the above-identified patent and that said Letters Patent is hereby corrected as shown below:

Drawings,
Sheet 2 of 4, FIG. 2 reads "SUSPECTOR" and should read -- SUSCEPTOR --.

Drawings,
Sheet 3 of 4, FIG. 3 reads "POLY XTAL SILICON" and should read -- POLYCRYSTALLINE SILICON --.

Column 2,
Line 8, reads "suicides" and should read -- silicides --.

Column 3,
Line 4, reads "suicides" and should read -- silicides --.
Line 19, reads "the intention" and should read -- the invention --.
Line 40, reads "is, disclosed" and should read -- is disclosed --.
Line 60, reads "450 KHz" and should read -- 450 kHz --.

Column 7,
Line 24, reads "inventor who is" and should read -- inventors who are --.

Signed and Sealed this

Thirteenth Day of July, 2004

JON W. DUDAS
*Acting Director of the United States Patent and Trademark Office*